United States Patent
Hahn

(10) Patent No.: US 8,558,214 B2
(45) Date of Patent: Oct. 15, 2013

(54) ELECTRONIC COMPONENT, METHODS FOR THE PRODUCTION THEREOF, AND USE THEREOF

(75) Inventor: Horst Hahn, Seeheim-Jugenheim (DE)

(73) Assignee: Karlsruher Institut fuer Technologie, Karlsruhe (DE)

( * ) Notice: Subject to any disclaimer, the term of this patent is extended or adjusted under 35 U.S.C. 154(b) by 453 days.

(21) Appl. No.: 12/677,848

(22) PCT Filed: Aug. 20, 2008

(86) PCT No.: PCT/EP2008/006818
§ 371 (c)(1),
(2), (4) Date: Mar. 12, 2010

(87) PCT Pub. No.: WO2009/036856
PCT Pub. Date: Mar. 26, 2009

(65) Prior Publication Data
US 2010/0308299 A1 Dec. 9, 2010

(30) Foreign Application Priority Data
Sep. 12, 2007 (DE) .......................... 10 2007 043 360

(51) Int. Cl.
*H01L 29/12* (2006.01)
*H01L 21/18* (2006.01)

(52) U.S. Cl.
USPC ........ 257/9; 257/E29.068; 257/321; 977/773; 438/478

(58) Field of Classification Search
USPC ........ 257/321, E29.068, 9; 977/773; 438/478
See application file for complete search history.

(56) References Cited

U.S. PATENT DOCUMENTS

| | | | |
|---|---|---|---|
| 6,751,083 B1 | 6/2004 | Gleiter et al. | |
| 7,382,017 B2 | 6/2008 | Duan et al. | |
| 7,575,978 B2 | 8/2009 | Kraus et al. | |
| 7,605,390 B2 | 10/2009 | Chen et al. | |
| 2005/0072989 A1* | 4/2005 | Bawendi et al. | 257/200 |
| 2006/0118853 A1* | 6/2006 | Takata et al. | 257/314 |
| 2007/0064468 A1 | 3/2007 | Seol et al. | |
| 2007/0132052 A1 | 6/2007 | Sargent et al. | |

FOREIGN PATENT DOCUMENTS

DE 19952447 C1 1/2001

OTHER PUBLICATIONS

Gleiter, Acta Materialia, vol. 49, No. 4, Feb. 23, 2001, p. 737-745.*
"Field-effect transitor" retrieved on Aug. 7, 2012 from http://en.wikipedia.org/wiki/Field-effect_transistor.*
"Dielectric" retrieved on Aug. 7, 2012 from http://en.wikipedia.org/wiki/Dielectric.*
"Electrode" retrieved on Aug. 7, 2012 from http://en.wikipedia.org/wiki/Electrolyte.*

(Continued)

*Primary Examiner* — Colleen Matthews
(74) *Attorney, Agent, or Firm* — Leydig, Voit & Mayer, Ltd.

(57) ABSTRACT

An electronic component includes a first and a second electrode. A layer of nanoparticles is disposed between the first and second electrodes. The layer of nanoparticles includes an electrically conducting compound of a metal and an element of Main Group VI of the Periodic Table. A dimension of a majority of the nanoparticles ranges from 0.1 to 10 times a screening length of the electrically conductive compound. A dielectric layer has at least one common interface with at least a part of the nanoparticles.

9 Claims, 4 Drawing Sheets

(56) References Cited

OTHER PUBLICATIONS

Panzer, Matthew et al, Low-voltage operation of a pentacene field-effect transistor with a polymer electrolyte gate dielectric, Feb. 28, 2005; Applied Physics Letters Lett. 86, 103503-1-3.*

Dasgupta, S et al., A nanoparticulate indium tin oxide field-effect transistor with solid electrolyte gating, Sep. 22, 2008, IOP Publishing Nanotechnology 19 425203 (6pp).*

Miroiu et al.: "Fabrication of law dimensional structions of ZnSe and ZnO by thermal and mechanical methods" Physica Status Solid C Wiley-vch Germany, No. 4, 2006, pp. 1066-1069.

Huang G-W et al: "One-pot synthesis and characterization of high-quality CdSe/ZnX (X=S, Se) nanocyrstals via the CdO precursor" Journal of Cyrsal Growth, Elsevier Amsterdam, NL, vol. 265, No. 1-2, Apr. 15, 2004, pp. 250-259.

International Search Report mailed Nov. 27, 2008 which issued during the prosecution of International Patent Application No. PCT/EP2008/006818; 6 pages.

J. Weissmüller, R.N. Viswanath, D. Kramer, P. Zimmer, R. Würschum and H. Gleiter: "*Charge-Induced Reversible Strain in a Metal*", Science 300 (Apr. 2003), p. 312-315.

C. Bansal, S. Sarkar, A.K. Mishra, T. Abraham, C. Lemier and H. Hahn: "*Electronically tunable conductivity of a nanoporous Au-Fe alloy*", Scripta Materialia 56 (Feb. 2007), p. 705-708.

M. Sagmeister, U. Brossmann, S. Landgraf and R. Würschum: "*Electrically Tunable Resistance of a Metal*", Phys. Rev. Lett. 96 (Apr. 2006), 156601.

R. Misra, M. McCarthy and A.F. Hebard: "*Electric field gating with ionic liquids*", Applied Physics Letters 90, (Jan. 2007) 052905.

* cited by examiner

ELECTRONIC COMPONENT, METHODS FOR THE PRODUCTION THEREOF, AND USE THEREOF

CROSS REFERENCE TO PRIOR APPLICATIONS

This application is a U.S. National Phase application under 35 U.S.C. §371 of International Application No. PCT/EP2008/006818, filed on Aug. 20, 2008 and which claims benefit to German Patent Application No. 10 2007 043 360.5, filed on Sep. 12, 2007. The International Application was published in German on Mar. 26, 2009 as WO 2009/036856 A1 under PCT Article 21(2).

FIELD

The present invention relates to an electronic component including a layer of nanoparticles, a method for the production thereof, and the use thereof.

BACKGROUND

In the recent years, it has been shown that it is possible to tune the structural and functional properties of metallic nanostructures in the form of thin films and nanoporous structures; i.e., structures having an extremely high surface-to-volume ratio.

The basic idea of the tunability of the electronic structure and properties of nanocrystalline materials was first described by H. Gleiter, J. Weissmuller, O. Wollersheim and R. Würschum, and published by them in Nanocrystalline Materials: A way to solids with tunable electronic structures and properties?, Acta Mater. 49 (2001), 737-745.

DE 199 52 447 C1 and J. Weissmüller, R. N. Viswanath, D. Kramer, P. Zimmer, R. Würschum and H. Gleiter in Charge-Induced Reversible Strain in a Metal, Science 300 (2003), 312-315, describe that reversible length changes of nanoporous gold can be achieved by accumulating electric charges at the interface of an electrolyte with the metallic nanostructures in a double layer.

C. Bansal, S. Sarkar, A. K. Mishra, T. Abraham, C. Lemier and H. Hahn described in Electronically tunable conductivity of a nanoporous Au—Fe alloy, Scripta Materialia 56 (2007), 705-708, that reversible changes in the electrical resistance of nanoporous gold and nanoporous Au—Fe alloys can be achieved by accumulating electric charges at the interface of an electrolyte with the metallic nanostructures in a double layer. The changes in the electrical resistance observed at applied charge densities of approximately 50 $\mu C/cm^2$ were in the range of a few percent.

In Electrically Tunable Resistance of a Metal, Phys. Rev. Lett. 96 (2006), 156601, M. Sagmeister, U. Brossmann, S. Landgraf, and R. Würschum described the same effect at the same order of magnitude for nanoporous Pt.

The concept of tunability of the electrical conductivity in semiconductors, such as Si and Ge, which is known as "electric field gating", has been established for decades and forms the basis for their use in electronics. The basic structure consists in an arrangement including a source and a drain coupled together by the semiconducting material, and a gate electrode isolated from the semiconductor by a suitable gate oxide. The conductivity of the semiconducting layer can be varied over a wide range by a gate voltage applied to the gate.

In the case of oxides, the region that can be influenced by interface charges; i.e., the space charge region, is much larger than in the above-mentioned metals, but smaller than in the case of semiconductors, which have a lower charge carrier density than conductive oxides. To date, however, hardly any studies have been conducted on the use of oxides as tunable materials.

As regards the functional properties of conductive oxides, R. Misra, M. McCarthy, and A. F. Hebard described the ability to control the electrical conductivity of a thin indium oxide layer in an ionic liquid, and to measure sheet impedance changes greater than four orders of magnitude, in Electric field gating with ionic liquids, Applied Physics Letters 90, (2007) 052905.

SUMMARY

An aspect of the present invention is to provide an electronic component which allows the electrical resistance in a multiplicity of nanoporous structures to be reversibly tuned over many orders of magnitude by applying a gate voltage thereto.

In an embodiment, the present invention provides an electronic component which includes a first and a second electrode. A layer of nanoparticles is disposed between the first and second electrodes. The layer of nanoparticles includes an electrically conducting compound of a metal and an element of Main Group VI of the Periodic Table. A dimension of a majority of the nanoparticles ranges from 0.1 to 10 times a screening length of the electrically conductive compound. A dielectric layer has at least one common interface with at least a part of the nanoparticles.

DETAILED DESCRIPTION OF THE DRAWINGS

The present invention is described in greater detail below on the basis of embodiments and of the drawings in which:

FIG. 1a) shows a prior art electronic component including a semiconducting or conducting oxide without an electrolyte;

FIG. 1b) shows a prior art electronic component including a semiconducting or conducting metal oxide with an electrolyte;

Figure 4A:
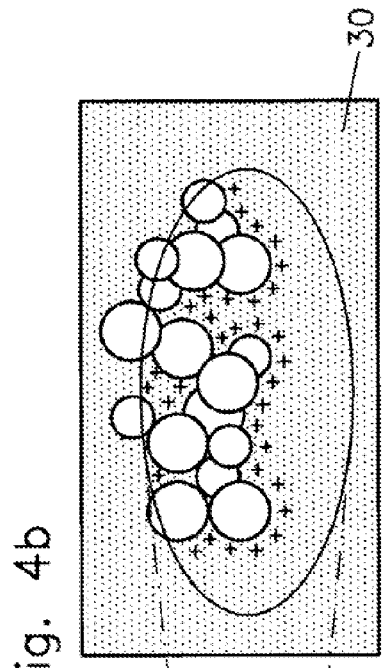
Figure 4B:
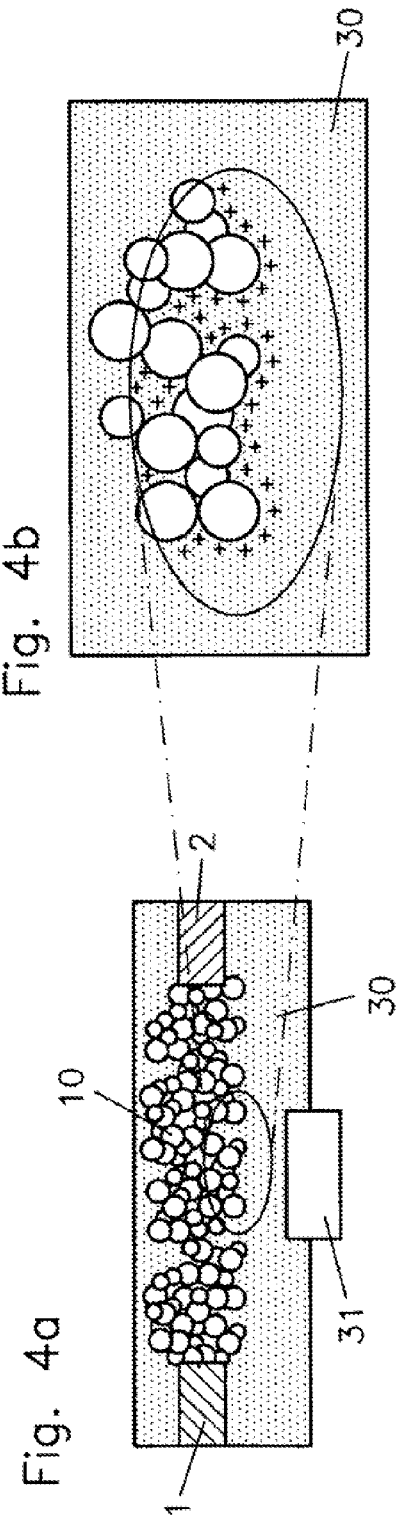
Figure 5A:
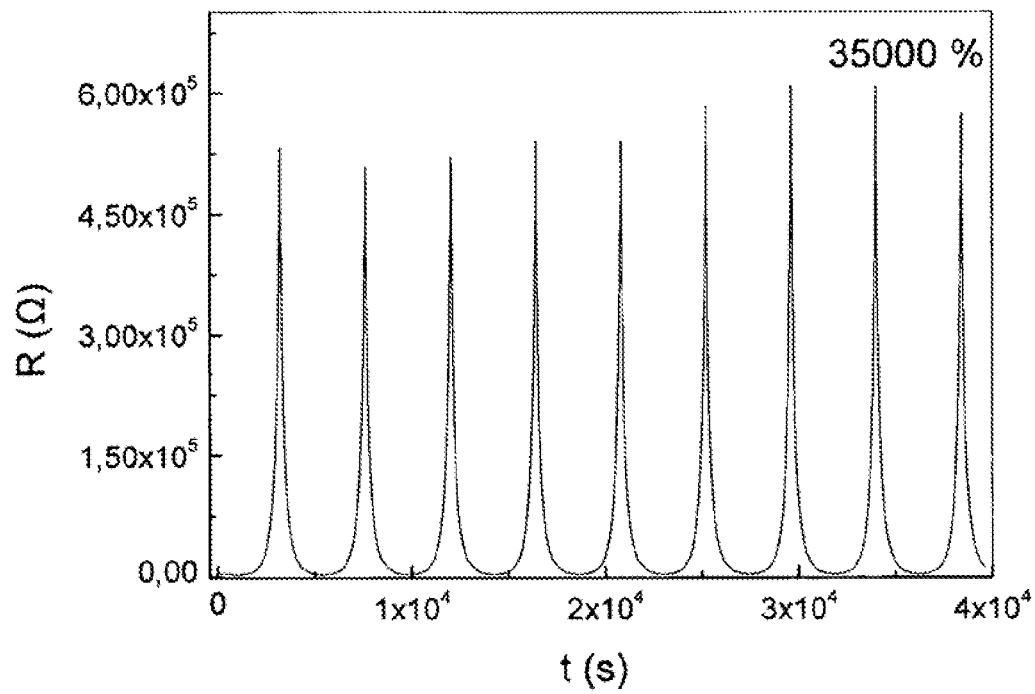
Figure 5B:
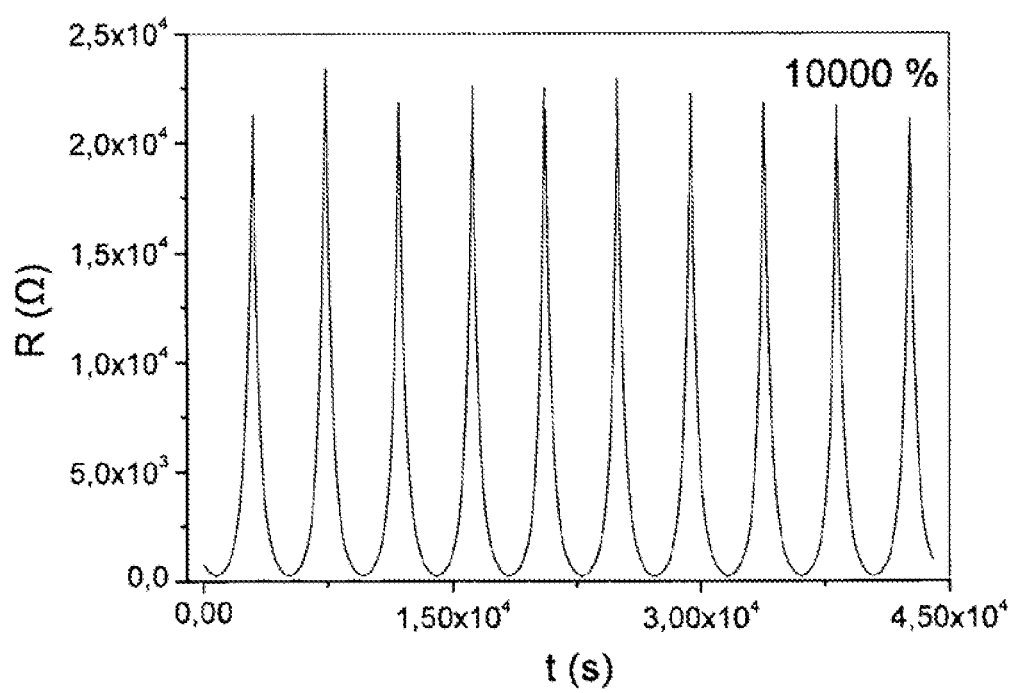
Figure 6A:
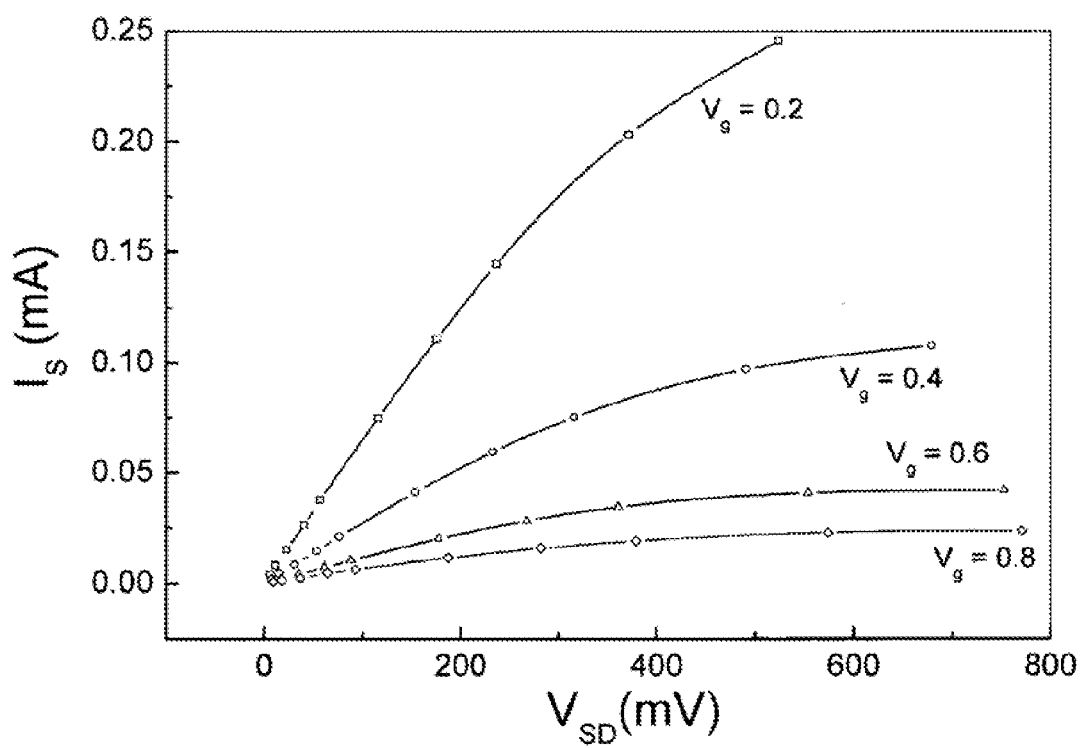
Figure 6B:
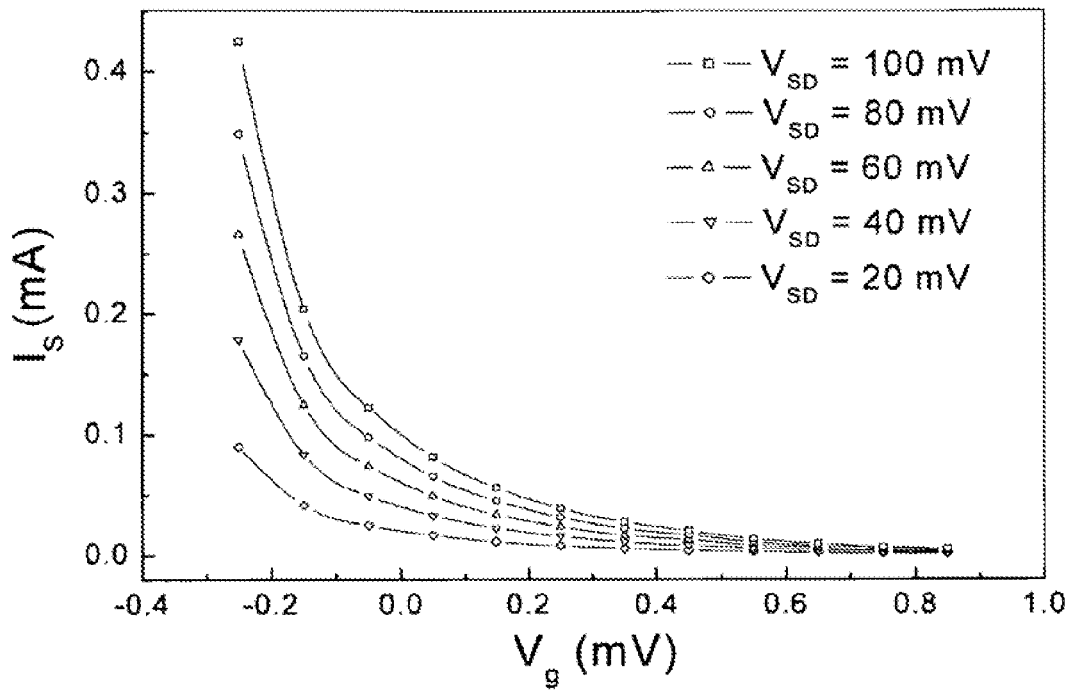
Figure 6C:
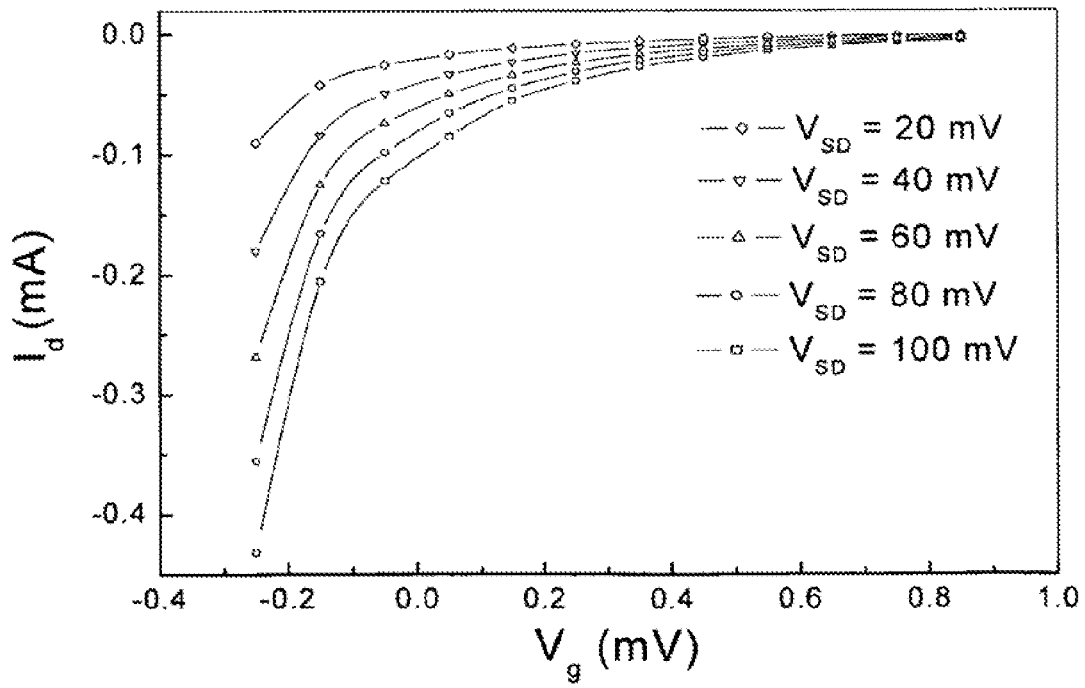

FIG. 4a) shows an electronic component according to the present invention, in which the dielectric is in the form of an electrolyte which, together with the nanoparticles of the layer, forms an interpenetrating network;

FIG. 4b) shows a zoomed-in portion of an electronic component according to the present invention, in which the dielectic is in the form of an electrolyte which, together with the nanoparticles of the layer, forms an interpenetrating network;

FIG. 5a) illustrates the change in electrical resistance over time of two electronic components according to the present invention when varying the gate voltage;

FIG. 5b) illustrates the change in electrical resistance over time of two electronic components according to the present invention when varying the gate voltage;

FIG. 6a) shows current-voltage characteristics of an electric component according to the present invention;

FIG. 6b) shows source characteristics of an electric component according to the present invention; and FIG. 6c) shows drain characteristics of an electric component according to the present invention.

DETAILED DESCRIPTION

An electronic component according to the present invention includes, firstly, two electrodes which act as source and drain for the component.

A layer of nanoparticles is located between these two electrodes, the nanoparticles being composed of an electrically conducting or semiconducting compound of a metal and an element of main group VI of the Periodic Table of the chemical elements, for example, an oxide, a sulfide, or a selenide.

The dimensions of the majority of the nanoparticles range should be between 0.1 times and 10 times the screening length of the electrically conductive compound.

An electronic component according to the present invention further includes a dielectric which has at least one common interface with at least part of the nanoparticles of the layer.

The nanoparticles within the layer can have particles sizes in the range of 5 nm to 500 nm. Located between the nanoparticles within the layer are pores having a pore size distribution, for example, in the range of 5 nm to 500 nm.

The nanoparticles can be composed of an electrically conductive metal oxide, metal sulfide or metal selenide. Examples include transparent conductive oxides, such as those of indium tin oxide (ITO), fluorine-doped tin(IV) oxide ($SnO_2$:F; PTO), antimony-doped tin(IV) oxide ($SnO_2$:Sb, ATO), or aluminum-doped zinc oxide (AZO). Nanoparticles of zinc oxide, titanium dioxide, zinc sulfide or cadmium sulfide can be used at elevated temperatures.

In one specific embodiment, the nanoparticles are present in the form of sintered nanoporous bulk structures, which were sintered at moderate temperatures. The pore structure has distinct grain boundaries/interfaces between the particles or grains of the inorganic phase.

In another embodiment, the nanoparticles are present in the form of loosely connected porous structures in which the interfaces between contacting particles of the inorganic phase are not very distinct.

In an embodiment of the present invention, the electronic component of the present invention includes a layer of nanoparticles which is deposited in the form of a planar structure on the dielectric. The dielectric itself is in the form of a planar dielectric layer which in turn is deposited on a planar electrically conductive layer. Therefore, between the thin layer of nanoparticles of the conducting or semiconducting compound and a suitable electrolyte, planar interfaces are formed between the compound and the dielectric.

In a further embodiment, the electronic component of the present invention includes a layer of nanoparticles which is deposited on an electrically insulating substrate. The dielectric is located on the surface of the layer of nanoparticles and is in direct contact with a control electrode. The dielectric (gate dielectric layer) can, for example, be deposited in the form of a dispersion and, therefore, conforms to the rough surface of the functional layer. This ensures that the effect of the present invention is also maximum for rough surfaces.

In an embodiment of the present invention, the electronic component includes a bi-continuous, interpenetrating composite network which is composed of semiconducting or conducting nanoparticles and a suitable electrolyte as a dielectric and which forms a system of complex-shaped arbitrary interfaces between the electrolyte and the individual nanoparticles. Here, too, the dielectric is in contact with a control electrode. The electrolyte itself may be present in a liquid or a solid phase.

By applying a potential, electric charges can be accumulated at the interface between the electrolyte and the nanoparticles. The electric charges are reversibly varied by changing the potential, which allows the electrical conductivity of the layer of nanoparticles to be reversibly changed. All surfaces of the nanoparticles are in direct contact with the electrolyte, which makes it possible to accumulate charges on all surfaces. In this manner, a high effect can be achieved, allowing the layer to be tuned over several orders of magnitude. The structure dimensions of the nanoparticles should be of the order of magnitude of the screening length to be able to vary the electrical conductivity of the oxide phase to a noticeable degree.

In order to optimize the capacitances of the present electronic component, only small surfaces should be used, such as is also required in components. This allows the switching times of the component to be kept to a minimum.

In order to operate the electronic component, a potential is applied between the layer of nanoparticles and a counter-electrode. This arrangement has already been implemented as an operational unit, and the reversible change in the electrical conductivity could be demonstrated over several orders of magnitude.

The structures of an electronic component according to the present invention may be synthesized using conventional layer preparation methods and subsequently covered with a liquid or solid electrolyte (dielectric).

Suitable layer preparation methods include, for example:
(1) sputtering or vacuum evaporation methods;
(2) spin coating or printing methods, such as screen-printing methods or ink-jet printing, of dispersions of the inorganic nanoparticles, followed by a sintering step;
(3) spin coating or printing methods, such as screen-printing methods or ink-jet printing, of electrolyte-containing dispersions of the inorganic nanoparticles, followed by an annealing step.

In methods (1) and (2), after producing the layer and, if necessary, performing a sintering or annealing step, the liquid or solid electrolyte is applied as an additional layer to the thin layer of the inorganic phase and subsequently provided with an electrode having a large surface area.

In method (3), the nanoparticles of the inorganic phase are directly dispersed in a liquid electrolyte and applied to a suitable substrate by spin coating or printing, for example, screen printing or ink-jet printing. This may be followed by an annealing step that is compatible with the substrates used, the chosen printing method and with the electrolyte and serves to achieve optimum electrical conductivity across the interfaces of the inorganic phase.

Instead of a liquid electrolyte, it is also possible to use an electrolyte which is liquid prior to drying and solidifies when dried. When using such an electrolyte, which solidifies when dried, the shrinkage of the electrolyte phase may be used to draw the inorganic nanoparticles together and thereby achieve higher electrical conductivity.

Electronic components according to the present invention may be used, for example, as diodes, transistors, voltage inverters or as sensors.

The use of nanocrystalline functional particles composed of a compound of a metal and an element of main group VI of the Periodic Table, such as oxides, sulfides and selenides, in combination with the use of the tunability of material properties by reversible charging in an electrolyte, leads to new possibilities for functional components in the field of printable electronics. The use of a printable electrolyte/nanoparticle mixture is suitable for printable electronics.

Figure 1A:
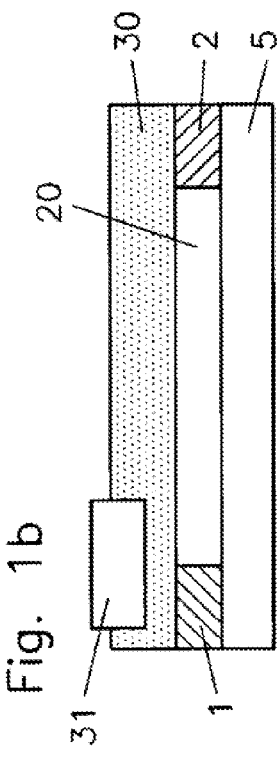

In the case of the electronic component shown in FIG. 1a), a conducting metal oxide was deposited in the form of a thin oxide film 20 on a dielectric layer 3 which acts as a gate and is applied to a conductive electrode 4 made of highly-doped silicon or metal. Electrodes 1, 2 for source and drain are directly deposited on oxide film 20. The electrical conductivity of oxide film 20 is varied by applying a gate voltage to dielectric layer 3.

Figure 1B:
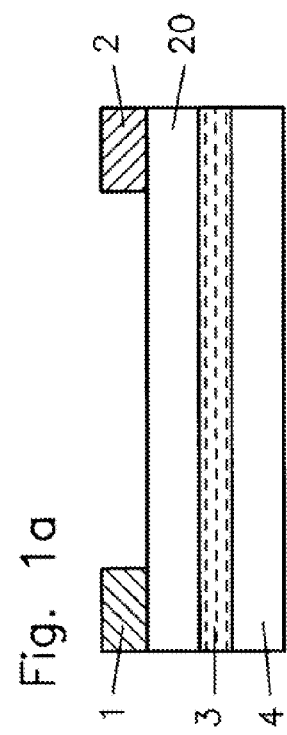

In the case of the electronic component shown in FIG. 1b), dielectric layer 3 of FIG. 1a), which acts as a gate, is replaced by a solid or liquid electrolyte 30. Therefore, in place of conductive electrode 4 (gate electrode), this component has a control electrode 31, which should have a large surface area to allow charges to be to transferred electrolyte 30 in the most rapid manner possible. Here, too, electrodes 1, 2 for source and drain are in direct contact with oxide film 20. The component is disposed on an electrically non-conductive substrate 5.

Figure 2:
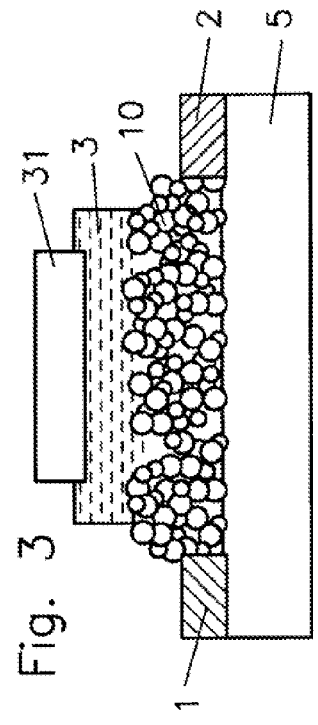
FIG. 2 shows an electronic component according to the present invention including a layer of nanoparticles in the form of a planar structure on a dielectric which is present in the form of a planar dielectric layer.
Figure 3:
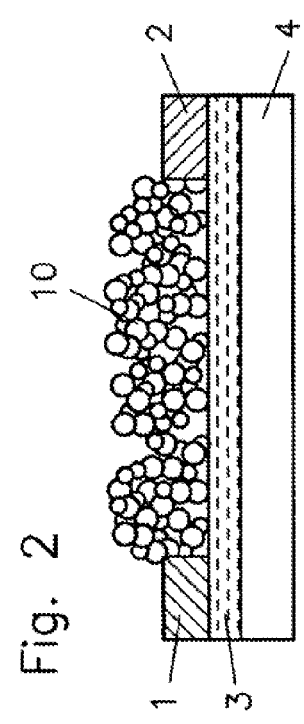
FIG. 3 shows an electronic component according to the present invention, in which the dielectric is located on the surface layer of nanoparticles.

FIGS. 2, 3, 4a) and 4b) show three embodiments of electronic components according to the present invention, whose active layers are each formed by a nanocrystalline oxide layer 10 composed of a semiconducting or conducting metal oxide.

FIG. 2 shows an electronic component according to the present invention. Here, an electrically conductive nanocrystalline oxide layer 10 was applied by a printing method with or without subsequent sintering to a dielectric layer 3 which acts as a gate and is disposed on a conductive electrode 4 made of highly-doped silicon or metal. Electrodes 1, 2 for source and drain are in direct contact with nanocrystalline oxide layer 10. The electrical conductivity of nanocrystalline layer 10 is varied by applying a gate voltage to dielectric layer 3.

FIG. 3 shows another embodiment of an electronic component according to the present invention. Here, electrically conductive nanocrystalline oxide layer 10 is disposed on an electrically non-conductive substrate 5 and is in direct contact with electrodes 1, 2 for source and drain. However, dielectric layer 3, which acts as a gate, was deposited in the form of a dispersion on the surface of nanocrystalline layer 10 and, therefore, conforms to the rough surface of nanocrystalline layer 10. This ensures that the effect underlying the present invention is also maximum for rough surfaces. Dielectric layer 3 is in direct contact with a gate electrode 31.

FIG. 4a) shows a particularly advantageous embodiment of a component according to the present invention. Here, an electrically conductive nanocrystalline oxide layer 10 is in direct contact with electrodes 1, 2 for source and drain, and dielectric layer 3 of FIG. 2, which acts as a gate, is replaced by a solid or liquid electrolyte 30. Electrolyte 30 is in contact with a control electrode 31. In this embodiment, too, the control electrode 31 must have a high surface area.

The change in the conductivity of nanocrystalline oxide layer 10 is brought about by a low voltage between control electrode 31 and nanocrystalline layer 10 between electrodes 1, 2 for source and drain. As exemplarily shown for positive charges in the enlarged view of FIG. 4b), positive charges are induced at the surfaces of the oxide particles. These charges are responsible for the change in the conductivity of nanocrystalline oxide layer 10.

The structure exemplarily illustrated in FIGS. 4a) and 4b) may be produced by forming a nanoparticulate film 10 by printing, especially screen-printing or ink-jet printing, between the two electrodes 1, 2, which act as source and drain, by subsequently sintering said film to create the conductive bridges between the individual nanoparticles, and by then infiltrating said film with a solid or liquid electrolyte 30. The element can then be switched by applying a control voltage between electrodes 1, 2 for source and drain and control electrode 31.

In an alternative embodiment, the nanoparticles are directly dispersed in an electrolyte which is liquid at the time the dispersion is made and during printing and which later either solidifies or remains liquid. The dispersed nanoparticles are then applied to a substrate in one step by a printing method. During the printing and drying process, conductive contacts are created between the nanoparticles of the conductive oxide, and, either immediately or after moderate temperature treatment, the component of the present invention is operational. This manufacturing method is particularly suitable for use in printable electronics.

In FIGS. 5a) and 5b), the electrical resistance of two different components according to the present invention is shown as a function of time as the control voltage applied between control electrode 31 and electrically conductive nanocrystalline layer 10 as an electrode is varied between −0.3 V and +0.8 V (FIG. 5a)) and, respectively, between −0.25 V and +0.85 V (FIG. 5b)). The variation (scan) was performed at a rate of 0.5 mV/s. Both components were configured according to FIG. 4a. The measurement results show that the electrical resistance of both components can be changed by a factor of 350 (=35 000%; FIG. 5a) and, respectively, of 100 (=10 000%; FIG. 5b) by simply varying the control voltage. Consequently, this effect is several orders of magnitude greater than the reversible changes in the electrical resistance of nanoporous gold and nanoporous Au—Fe alloys described by C. Bansal et al. in Scripta Materialia 56 (2007), 705 ff.

FIG. 6a) shows the current-voltage characteristics of a component according to the present invention, and demonstrates that such component can be operated as a transistor.

FIGS. 6b) and FIG. 6c) illustrate the source characteristics and, respectively, the drain characteristics of a component according to the present invention. A comparison of these two sets of characteristics confirms that the effects illustrated in FIGS. 5a) and 5b) do not originate from leakage currents between electrodes 1, 2.

The present invention is not limited to embodiments described herein; reference should be had to the appended claims.

What is claimed is:

1. An electronic component comprising:
   a first and a second electrode;
   a layer of nanoparticles disposed between the first and second electrodes, the layer of nanoparticles including an electrically conducting compound of a metal and an element of Main Group VI of the Periodic Table, a dimension of a majority of the nanoparticles ranging from 0.1 to 10 times a screening length of the electrically conductive compound;
   a dielectric formed by a solid or liquid electrolyte which, together with the layer of nanoparticles, forms an interpenetrating network having arbitrary interfaces between the electrolyte and the nanoparticles; and
   a control electrode in direct contact with the dielectric.

2. The electronic component as recited in claim 1, wherein the layer of nanoparticles includes nanoparticles having a particle size of from 5 nm to 500 nm and pores having a pore size distribution of from 5 nm to 500 nm, the pores being disposed between the nanoparticles within the disposed layer of nanoparticles.

3. The electronic component as recited in claim 1, wherein the nanoparticles include at least one of an electrically conductive metal oxide, metal sulfide and metal selenide.

4. The electronic component as recited in claim 3, wherein the nanoparticles include at least one of indium tin oxide, fluorine-or antimony-doped tin(IV) oxide and aluminum-doped zinc oxide.

5. The electronic component as recited in claim 3, wherein the nanoparticles include at least one of zinc oxide, titanium dioxide, zinc sulfide and cadmium sulfide.

6. A method for producing an electronic component, the method comprising:
   providing a first and a second electrode;
   disposing a layer of nanoparticles between the first and second electrodes;
   covering the nanoparticles with a solid or liquid electrolyte so as to form a dielectric which, together with the layer of nanoparticles, forms an interpenetrating network having arbitrary interfaces between the electrolyte and the nanoparticles; and
   providing a control electrode in direct contact with the dielectric.

7. The method as recited in claim 6, wherein the disposing and the covering are performed in a single step by spin coating or printing a substrate using the liquid electrolyte having the nanoparticles dispersed therein.

8. The method as recited in claim 7, further comprising performing an annealing step after the spin coating or printing.

9. The method as recited in claim 7, wherein the liquid electrolyte is configured to solidify after application thereof to the substrate.

* * * * *